US008865114B2

(12) United States Patent
Park et al.

(10) Patent No.: US 8,865,114 B2
(45) Date of Patent: Oct. 21, 2014

(54) METHOD FOR MANUFACTURING NANOSTRUCTURE AND NANOSTRUCTURE MANUFACTURED BY THE SAME

(75) Inventors: Inkyu Park, Daejeon (KR); Seung Hwan Ko, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 457 days.

(21) Appl. No.: 12/769,241

(22) Filed: Apr. 28, 2010

(65) Prior Publication Data

US 2011/0008245 A1 Jan. 13, 2011

(30) Foreign Application Priority Data

Jul. 7, 2009 (KR) .................. 10-2009-0061510
Feb. 16, 2010 (KR) .................. 10-2010-0013750

(51) Int. Cl.
*C01G 9/02* (2006.01)

(52) U.S. Cl.
USPC ........ 423/622; 423/606; 423/561.1; 423/618; 977/762

(58) Field of Classification Search
USPC ................... 423/561.1, 622, 605; 427/597; 977/762.892, 811, 812
See application file for complete search history.

(56) References Cited

U.S. PATENT DOCUMENTS 6,734,081 B1 * 5/2004 Puchner et al. ............... 438/432

FOREIGN PATENT DOCUMENTS

JP          2008251871        10/2008
JP          2008251871  A  * 10/2008
KR     1020090059568  A      6/2009

OTHER PUBLICATIONS

"Zinc Nitrate Hexahydrate MSDS". Chemical Land 21. http://www.chemicalland21.com/industrialchem/inorganic/ZINC%20NITRATE%20HEXAHYDRATE.htm via Archive.org Mar. 17, 2006. Accessed Feb. 2, 2012.*
"Controlled Growth of Well-Aligned ZnO Nanorod Array Using a Novel Solution Method" Youngjo Tak and and Kijung Yong The Journal of Physical Chemistry B 2005 109 (41), 19263-19269.*
Maeng et al. "SOI CMOS-Based Smart Gas Sensor System for Ubiquitous Sensor Networks". ETRI Journal, vol. 30, No. 4, Aug. 2008.*
Sadek et al. A ZnO nanorod based layered ZnO/64 ° YX LiNbO3 SAW hydrogen gas sensor. Thin Solid Films. 515 (2007) 8705-8708.*
Kim, Y., et al. "CuO nanowire gas sensors for air quality control in automotive cabin". Sensors and Actuators B 135 (2008) 298-303.*

(Continued)

*Primary Examiner* — Richard M Rump
(74) *Attorney, Agent, or Firm* — Lowe Hauptman & Ham, LLP

(57) ABSTRACT

Provided are methods for producing nanostructures and nanostructures obtained thereby. The methods include heating a certain point of a substrate dipped into a precursor solution of the nanostructures so that the nanostructures are grown in a liquid phase environment without evaporation of the precursor solution. The methods show excellent cost-effectiveness because of the lack of a need for precursor evaporation at high temperature. In addition, unlike the vapor-liquid-solid (VLS) process performed in a vapor phase, the method includes growing nanostructures in a liquid phase environment, and thus provides excellent safety and eco-friendly characteristics as well as cost-effectiveness. Further, the method includes locally heating a substrate dipped into a precursor solution merely at a point where the nanostructures are to be grown, so that the nanostructures are grown directly at a desired point of the substrate. Therefore, it is possible to grow and produce nanostructures directly in a device. As a result, unlike the conventional process, it is not necessary to assemble and integrate the nanostructures produced in a sacrificial substrate into a device.

8 Claims, 21 Drawing Sheets

(56) References Cited

OTHER PUBLICATIONS

Vayssieres, L. "Growth of Arrayed Nanorods and Nanowires of ZnO from Aqueous Solutions" Adv. Mater. 2003 15 (5).*

Sugunan, A., et al. "Zinc oxide nanowires in chemical bath on seeded substrates: Role of hexamine". J Sol-Gel Sci Techn (2006) 39:49-56.*

Daejong Yang and Inkyu Park, Flexible Photonic Sensor based on Locally Synthesized Metal Oxide Nanowire Network, The School of Mechanical, Aerospace, and Systems Engineering, Korea Advanced Institute of Science and Technology (KAIST), 2010, pp. 1-5, IEEE, Daejeon, South Korea.

Daejong Yang, Inkyu Park and Chong OoK Park, H2 and NO2 gas sensor using selectively synthesized and integrated metal oxide nanostructures via localized hydrothermal reaction, Department of Mechanical Engineering, Department of Materials Science and Engineering, Korea Advanced Institute of Science and Technology (KAIST), pp. 203-204, FP-2-27, Daejeon, South Korea, 2013.

Daejong Yang, Jaehwan Lee, Zhiyong Li, Jae-Hyn Kim and Inkyu Park, Zinc Oxide Nanowire-Based Flexible Photonic Sensor Fabricated by Novel Direct Integration Method and its Mechanical Robustness Characterization, Mechnical Engineering Department, KAIST, Intelligent Infrastructure Lab, Hewlett Packard Laboratory, Nano Mechnical System Research Center, Korea Institute of Machinery & Materials, Apr. 9, 2011, pp. 315-316, SP-3-13, Palo Alto, CA, USA.

Daejong Yang, Donghwan Kim and Inkyu Park, Ambient Light Sensor based on TiO2 Nanotubes via Local and Low-Temperature Wet Chemical Reaction, Mechnical Engineering Department & KI for the NanoCentury, KAIST, Apr. 6, 2012, pp. 165-166, FO-2-03, Daejeon, South Korea.

Daejong Yang, Muhamad Kasyful Fuadi, Donghwan Kim and Inkyu Park, Fabrication of Heterogeneous Nanomaterials Array by using Low-Temperature Wet Chemical Reaction for Multiplexed Gas Sensor, Mechanical Engineering Department & KI NanoCentury, Korea Electric Power Research Institute, Apr. 5, 2013, pp. 221-222, FP-2-23, Daejeon, South Korea.

D. Yang, J.H. Lee, Z.Li, J.H. Kim, J.M. Park and I. Park, Bendable and stretchable photonic sensor based on zinc oxide nanowires fabricated by novel directed integration method, Korea Advanced Institute of Science and Technology, Republic of Korea, Nov. 28, 2012, Hewlett Packard, Laboratory, USA, Korea Instutute of Machinery & Materials, Republic of Korea, P8-56.

D. Kim, M.A. Lim, D. Yang, Z. Li, C.O. Park and I. Park, Ultra-Sensitive, Low-Power and Flexible H2S Sensors Based on Palladium Nanoparticle-Coated Metal Oxide Nanowires, pp. 1372-1375, MEMS 2012, Paris, France.

I. Park, D. Kim, D. Yang, M.A. Lim and J. Lee, Fabrication Process for the Nanomaterials-based Flexible Enviornment Sensors, 2011, p. 52.

D. Kim, M.A. Lim, D. Yang, Z. Li, C.O. Park and I. Park, Locally Synthesized Metal Oxide Nanowire-Devices and Their Gas Sensing Applications, Transducers'11, Jun. 5-9, 2011, pp. 791-794, M4D. 004, Beijing, China.

D. Yang, M.K. Fuadi, Z. Li and I. Park, Facile Fabrication of Heterogeneous Nanomaterial Array Towards Low-Power and Multiplexed Gas Sensing Application, Transducers'13, Jun. 16-20, 2013, pp. 2580-2583, Th1C.005, Barcelona, Spain.

Daejong Yang, Jaehwan Lee, Zhiyong Li, Jae-Hyun Kim, Jeong Min Park and Inkyu Park, Flexible ZnO Nanowire Photonic Sensor and its Mechanical Robustness, The 17th International Conference on Solid-State Sensors, Actuators and Microsystems, Transducers 2013, Jun. 20, 2013, pp. 2886-2888.

Daejong Yang, Jaehwan Lee, Zhiyong Li, Jae-Hyun Kim and Inkyu Park, ZnO Nanowire Photonic Sensor on Flexible Film Made by Localized Hydrothermal Synthesis Method and its Sensing Characteristics under Bending and Tensile Conditions, pp. 17-18, 2011, Hewlett Packard Laboratory Intelligent Infrastructure Lab.

Daejong Yang, Muhamad K. Fuadi, Kyungnam Kang, Chong-Ook Park and Inkyu Park, Heterogeneous nanostructure array gas sensor fabricated by local heating and wet chemical reaction, 2013, p. 45, Daejeon, South Korea.

Daejong Yang, Donghwan Kim and Inkyu Park, Visible Light Sensor based on Locally Synthesized and defect controlled TiO2 nanotube, May 26, 2011, pp. 2683-2685.

Daejong Yang, Donghwan Kim and Inkyu Park, Symposium FF: Semiconductor Nanowires—Optical and Electronic Characterization and Applications, p. 30, FF13.04, 2012 MRS Fall Meeting.

* cited by examiner (1) CATALYST  (2) GROWTH  (3) RECOVERY  (4) ASSEMBLY, ALIGNMENT

METHOD FOR MANUFACTURING NANOSTRUCTURE AND NANOSTRUCTURE MANUFACTURED BY THE SAME

CROSS-REFERENCE(S) TO RELATED APPLICATIONS

The present invention claims priority of Korean Patent Application Nos. 10-2009-0061510 filed on Jul. 7, 2009 and 10-2010-0013750 filed on Feb. 16, 2010, which are incorporated herein by reference.

BACKGROUND OF THE INVENTION

1. Field of the Invention

The present invention relates to a method for producing nanostructures and nanostructures obtained by the same method. More particularly, the present invention relates to a method for producing nanostructures having a desired shape easily with excellent cost-efficiency and safety by allowing nanostructures to grow in a liquid phase environment, unlike a conventional vapor-liquid-solid (VLS) process performed in a vapor phase, as well as to nanostructures obtained by the same method.

2. Description of Related Art

NEMS is the abbreviation of nanoelectromechanical systems and refers to the field of nano-scaled ultra-compact precision machines smaller than microelectromechanical systems (MEMS). One of the outcomes of such NEMS is to produce sensors and actuators based on nanowires.

FIG. 1 is a schematic view showing a process including formation of nanostructures, growth of the nanostructures, recovery of the nanostructures and assembly of the nanostructures in accordance with the prior art.

As shown in FIG. 1, the process for applying nanowires to a device according to the prior art includes: growing nanowires on a separate substrate by a catalyst; separating and recovering the grown nanowires from the substrate; and assembling and aligning the nanowires in a device, such as an NEMS device. However, the above process is not cost-effective in that the nanowires have to be separated from the substrate through an additional step after they are grown, and then assembled and aligned in a device.

In addition, the most general process of the conventional nanowire growing processes is a vapor-liquid-solid (VLS) process. The VLS process was suggested by Wagner et al. in 1960's in order to grow micrometer-scaled single crystals. Recently, the VLS process has been applied to the growth of single crystalline nanowire structures of inorganic compounds by many researchers.

FIG. 2 is a schematic view showing a VLS mechanism for the growth of nanowires.

As shown in FIG. 2, the solid/liquid phase equilibrium diagram of a mixture demonstrates that an alloy of two metal substances melts at a temperature lower than the unique melting points of the two substances. In the VLS process, nanoparticles of noble metals, such as gold (Au) or silver (Ag) which are stable at high temperature and have a relatively lower melting point, are applied to a substrate, and a substance to be grown or a precursor thereof having a relatively higher melting point is allowed to evaporate at high temperature. As the evaporated reactant gas dissolves into the liquid droplets of the noble metals, the reactants reach a supersaturated state. While the supersaturated reactants pass through a liquid state and are precipitated in the form of a solid material, the solid material grows in one direction, and thus a one-dimensional substance grows. In general, metals are used as the growing substance to maintain the phase equilibrium with ease, and the atmospheric gas is controlled for a metal compound structure, such as a compound semiconductor, to control the form of oxides or sulfides.

The reaction procedure of the VLS process starts with dissolution of a reactant gas in a vapor phase into nano-sized molten particle droplets functioning as a catalyst. Herein, as the concentration of the reactant gas increases, nucleation of the reactant is performed by the phase equilibrium of the mixture. Then, such nucleation is used to grow single crystalline nanowires or nanorods. Ideally, one-dimensional growth is maintained by the molten metal nanodrops and the grown nanowires have a diameter or thickness determined by the size of the metal nanodrops.

However, the conventional VLS process has the problems as described hereinafter.

First, high temperature is required to perform evaporation of a substance to be grown or a precursor thereof. In other words, since the gas of the precursor, etc. should be dissolved into a liquid catalyst at a temperature above the eutectic point of alloy, a relatively high temperature is required.

Next, in addition to such a high temperature, a harmful or flammable gas is used essentially. Thus, the work environment is very harmful and dangerous. For example, $SiH_4$ that may explode should be used in the case of silicon nanowires (SiNW), $GeH_4$ that are toxic and may explode should be used in the case of germanium nanowires (GeNW), and methane that may explode should be used in the case of carbon nanotubes. Under these circumstances, it is very difficult to control or regulate the work environment. In some cases, the operators may be exposed to a hazardous environment.

In addition, even though nanostructures are obtained through the VLS process, the resultant nanostructure should be integrated and assembled again to obtain a desired shape. Thus, the overall process is complicated and is not cost-effective. Moreover, when the resultant nanostructures are integrated or assembled in an additional step, it is practically difficult to produce nanostructures with various shapes at a desired position.

Further, according to the prior art, there has been an attempt to carry out the VLS process using a heater or laser so as to integrate the three steps, i.e., growth-separation-assembly, into one step. However, such an attempt is still problematic because of the fundamental limitation of the VLS process itself, low flexibility in an operational process change, and a need of an expensive vacuum chamber due to the use of gas precursors. Moreover, there is a technical limitation in producing various types of nanostructures except carbon nanotubes or single crystalline nanowires.

SUMMARY OF THE INVENTION

An object of the present invention is to provide a novel method for producing nanostructures, which has excellent cost-effectiveness and safety, and facilitates direct production of nanostructures having a desired shape at a desired position in a device.

Another object of the present invention is to provide nanostructures produced directly at a desired position in a device with a desired shape in a cost-efficient and safe manner.

In one aspect of the present invention, there is provided a method for producing nanostructures by heating a certain point of a substrate dipped into a precursor solution of the nanostructures so that the nanostructures are directly grown in a liquid phase environment without evaporation of the precursor materials.

According to an embodiment of the present invention, the nanostructures are grown without boiling of the precursor solution.

According to an embodiment of the present invention, the nanostructures are grown via a hydrothermal reaction, and the heating may be carried out by a heater provided in a certain position of the substrate or photon energy applied to a certain point.

According to another embodiment of the present invention, the heating is carried out at a temperature below the boiling point of the precursor solution to avoid the side effects from precursor solution boiling.

According to still another embodiment of the present invention, the substrate is provided with a seed layer of the growing nanostructures.

According to still another embodiment of the present invention, the nanostructure is at least one of metal oxides or sulfide nanowires selected from the group consisting of ZnO, $MoO_3$, $Bi_2S_3$, $SnO_2$, $V_2O_5$, $MnO_2$, PbS, $CoFe_2O_4$ and $WO_3$.

According to still another embodiment of the present invention, the precursor solution of the nanostructures is an aqueous solution containing a metal salt of the nanostructures to be grown and ammonia, the photon energy may be generated from a laser beam source, and a film absorbing photon energy is further provided under the seed layer.

According to still another embodiment of the present invention, the heater is allowed to be in contact with the precursor solution, and the heater that is in contact with the precursor solution is provided with seed particles of the nanostructure. In addition, the substrate may be a conductive electrode material.

In another aspect of the present invention, there are provided nanostructures obtained by the above-described method. The nanostructures are grown directly by a hydrothermal reaction from a local heat on the conductive electrode material.

According to an embodiment of the present invention, the nanostructure is a metal oxide nanowire.

The method for producing nanostructures according to the present invention shows excellent cost-efficiency because of the lack of a need for evaporation at high temperature. In addition, unlike the vapor-liquid-solid (VLS) process performed in a vapor phase, the method according to the present invention includes the growth of nanostructures in a liquid phase environment, and thus provides excellent safety and eco-friendly characteristics as well as cost-efficiency. Further, the method includes local heating a substrate dipped into a precursor solution merely at a point where the nanostructures are to be grown, so that the nanostructures are grown directly at a desired point of the substrate. Therefore, it is possible to grow and produce nanostructures directly in a device. As a result, unlike the conventional process, it is not necessary to assemble and integrate the nanostructures produced in a sacrificial substrate into a device.

DESCRIPTION OF SPECIFIC EMBODIMENTS

Figure 1:
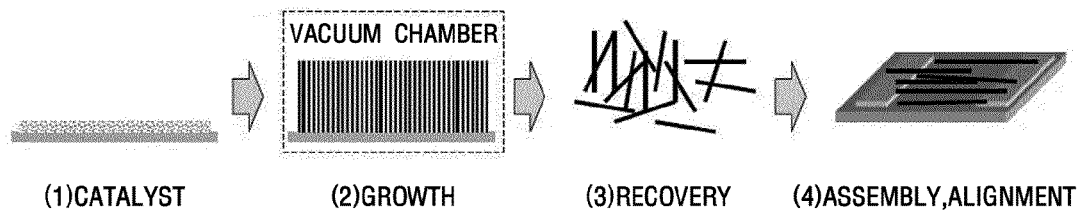
FIG. 1 is a schematic view showing a process including formation of nanostructures, growth of the nanostructures, recovery of the nanostructures and assembly of the nanostructures in accordance with the prior art.
Figure 2:
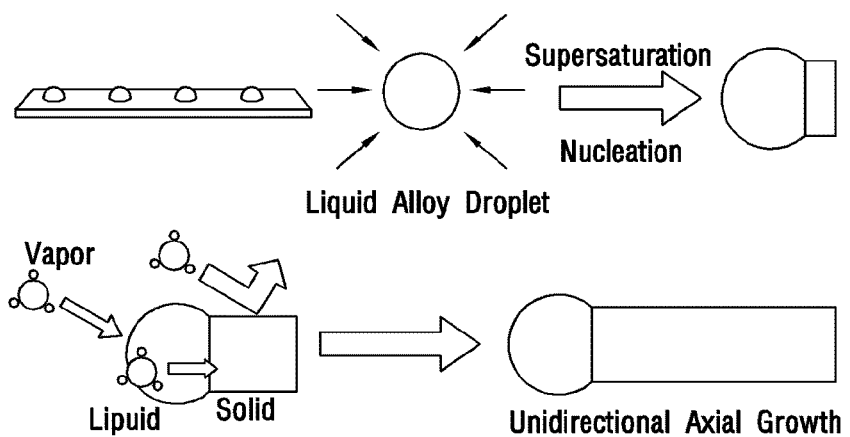
FIG. 2 is a schematic view showing a vapor-liquid-solid (VLS) mechanism for the growth of nanowires.

The advantages, features and aspects of the invention will become apparent from the following description of the embodiments with reference to the accompanying drawings, which is set forth hereinafter. Therefore, the present invention is not to be duly limited to the illustrative embodiments and may be embodied in other forms. In the drawings, like reference numerals in the drawings denote like elements. The shape, size and regions, and the like, of the drawing may be exaggerated in scale for clarity.

As used herein, the term 'nanostructures' includes nanotubes, nanowires, nanocrystals, or the like, and means any structures having a nano-scaled size. The term 'laser' refers to a means that applies photon energy to a desired temperature at a desired position to generate heat energy from photon energy, and the size or constitution thereof may be freely selected and changed without departing from the scope and spirit of the present invention.

Unlike the prior art including growing nanowires in a vapor phase or heating/evaporating a solution itself, the method in accordance with an embodiment of the present invention includes growing nanowires by heating only a specific point (wherein the term 'point' includes a site in the form of a line or surface as well as a dot and such a site will be referred to as 'point' for simplicity) of a substrate in a liquid phase environment. In other words, the method in accordance with an embodiment of the present invention relates to growth of nanostructures, such as nanowires, directly in a liquid phase environment, wherein the direct growth of the nanostructure is accomplished by locally heating a substrate (e.g. an electrode of a device) dipped into a precursor solution of the nanostructures. Herein, the local heating of the substrate allows the precursor solution adjacent to the substrate to be heated to a temperature above the synthesis temperature of nanostructures, but below its boiling point. As a result, while the precursor solution is not evaporated, it is heated to such a temperature that allows the direct growth of the nanostructures at the desired point. In one embodiment of the present invention, the nanostructure is a metal oxide or sulfide nanowire, including a nanowire formed of a metal or sulfide oxide, such as ZnO, $MoO_3$, $Bi_2S_3$, $SnO_2$, $V_2O_5$, $MnO_2$, PbS, $CoFe_2O_4$ and $WO_3$.

The heating may be carried out in two different modes. One is heating by a micro heater and the other is heating by photon energy, such as laser beams. Hereinafter, the two types of the methods of growing nanostructures and the results obtained therefrom will be explained in detail.

EXAMPLE 1

Method of Producing Nanostructures Using Heater

Figure 3:
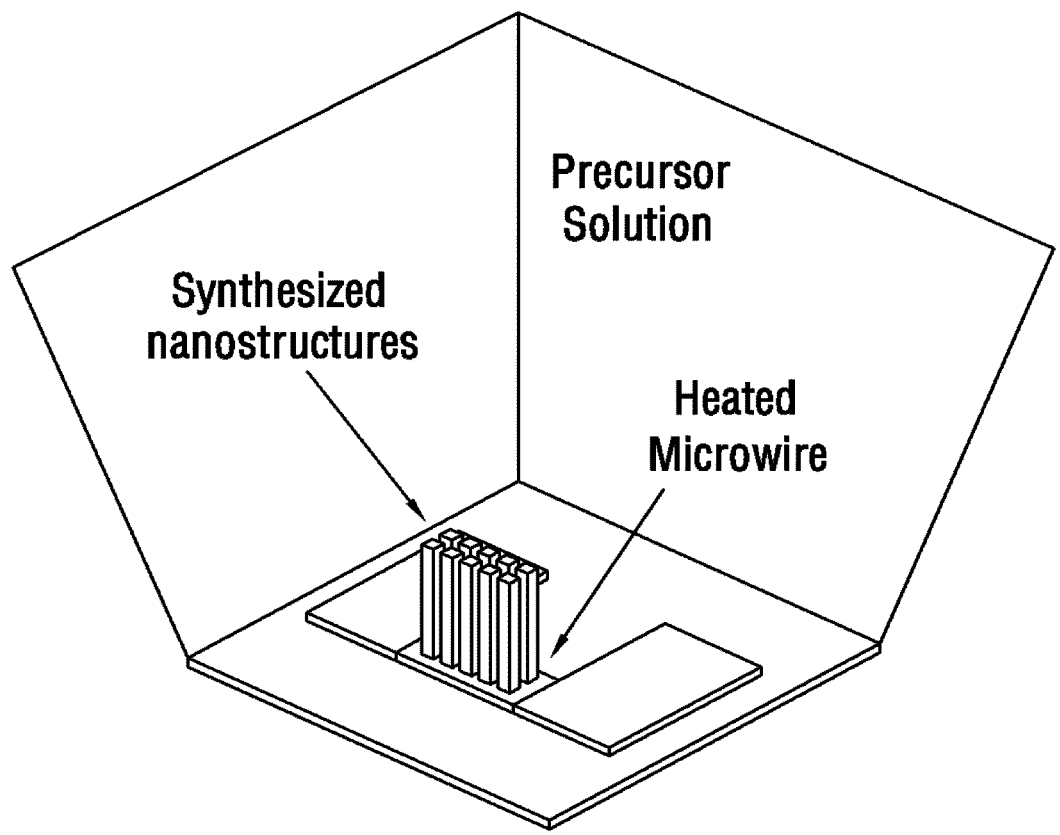
FIG. 3 is a schematic view illustrating a method for producing nanostructures locally by a micro heater in accordance with an embodiment of the present invention.

FIG. 3 is a schematic view illustrating a method for producing nanostructures by using a micro heater in accordance with an embodiment of the present invention.

Referring to FIG. 3, the method for producing nanostructures according to an embodiment of the present invention allows the nanostructures to grow in a bottom-up mode under the liquid environment of a precursor solution, unlike vapor-liquid-solid (VLS) performed in a vapor phase by evaporating precursor materials, etc. Thus, an embodiment of the present invention is based on the finding that when growing nanostructures by heating a precursor solution locally and selectively with a heater, the growth of nanostructures and the location thereof are controlled by the heater. In this case, the initial generation, growth, integration, etc. of the nanostructures may be carried out in a one-step mode.

Figure 4:
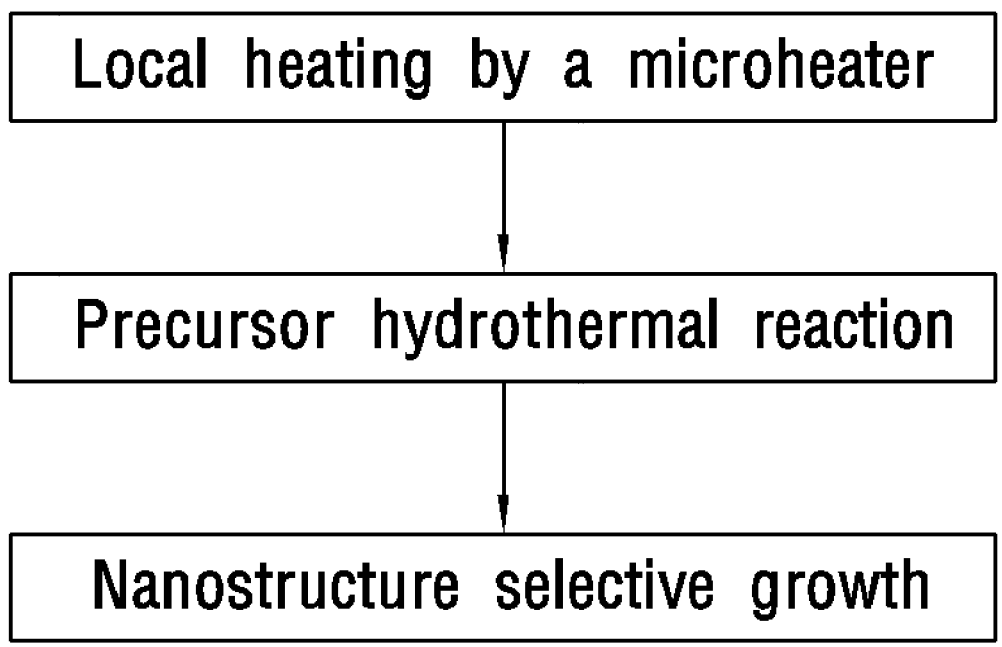
FIG. 4 is a flow chart of the method for producing nanostructures according to an embodiment of the present invention.

FIG. 4 is a flow chart of the method for producing nanostructures according to an embodiment of the present invention.

Referring to FIG. 4, a liquid precursor of a substance to be grown is heated first by a heater that is in direct or indirect contact with the liquid precursor. Herein, the term 'heater' refers to any means capable of heating the liquid precursor in a micro-scale so that nanostructures, such as nanocrystals, may be grown from nanoparticle seeds. The size or shape of the heater is not limited to the embodiments set forth herein.

The precursor solution may be selected freely depending on the particular substance to be grown into nanostructures. For example, as a precursor solution, $Zn(NO_3)_2 \cdot 6H_2O$ may be used in the case of ZnO nanowires, $SnCl_4 \cdot 5H_2O$ may be used in the case of $SnO_2$ nanowires, $VOSO_4 \cdot xH_2O$ may be used in the case of $V_2O_5$ nanowires, and $KMnO_4/MnSO_4$ may be used in the case of $MnO_2$ nanowires.

In one embodiment of the present invention, the micro heater is provided on two opposite electrode substrates. The nanostructures grown by the heater connect the two parallel electrodes physically with each other with the lapse of time. In this manner, the nanostructures formed between the two electrodes may be used as various types of sensors.

In another embodiment of the present invention, the heater is provided with seed particles or a seed layer by which initial nanostructures may be grown. The seed particles provide a growth site, where the nanostructures may be grown by the initial endothermic reaction. For example, in one embodiment of the present invention for growing ZnO, the seed particles are ZnO particles. In this manner, the same kind of nanoparticles as the nanostructures to be grown may be used as seed particles. The position of the seed particles and the thermal energy applied to the seed particles facilitate the growth, particularly the selective growth, and the integration of the nanostructures.

The precursor heated locally by the heater is subjected to an endothermic reaction. As the result of the reaction, nanostructures grow only at the portion heated by the heater. In other words, an embodiment of the present invention provides a method characterized in that the reaction for growing nanostructures from the precursor is endothermic, and that the precursor is heated locally even in a liquid phase. Hereinafter, the nanostructures obtained from the method will be explained in detail.

Subject Material

In one embodiment of the present invention, the nanostructure is ZnO. However, the scope of the present invention is not limited thereto and any material that allows growth of nanostructures via a hydrothermal chemical reaction may be applied to the present invention. The scope of the present invention is not limited to ZnO set forth herein. For example, materials that may be applied to the present invention include: $MoO_3$ for use in displays, sensors, battery electrodes, catalysts, etc., $Bi_2S_3$ for use in photodiodes, photovoltaic cell devices, thermoelectrical cooling devices, etc., $SnO_2$ for use in gas sensors, photovoltaic cell devices, optoelectrical devices, etc., $V_2O_5$ for use in catalysts, electrochemical devices, etc., $MnO_2$ used as an electrode of electrochemical devices, PbS for use in ion sensors, IR detection sensors, solar absorbing materials, etc., $CoFe_2O_4$ for use in transformer cores, antenna rods, magnetic memories, etc., and $WO_3$ for use in gas sensors, catalysts, photodata storing devices, etc. In addition to the above, any nanostructure capable of being grown by an endothermic reaction and having a precursor thereof present in a liquid phase may be included in the scope of the present invention.

Apparatus for Production

Figure 5:
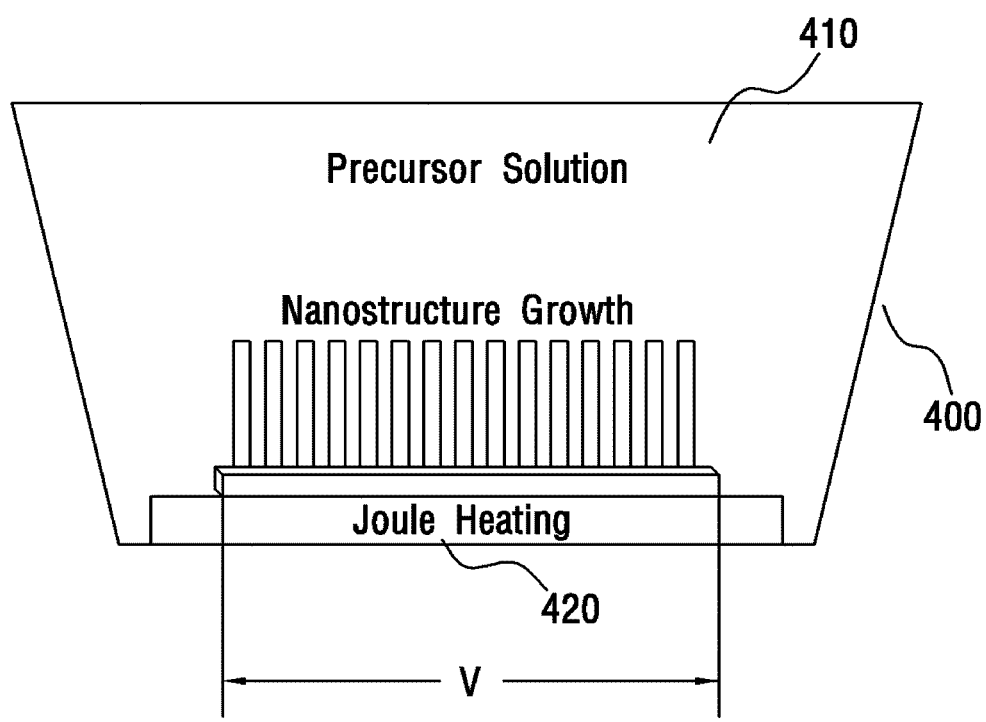
FIG. 5 is a schematic view of an apparatus for producing nanostructures locally by a micro heater in accordance with an embodiment of the present invention.
Figure 6:
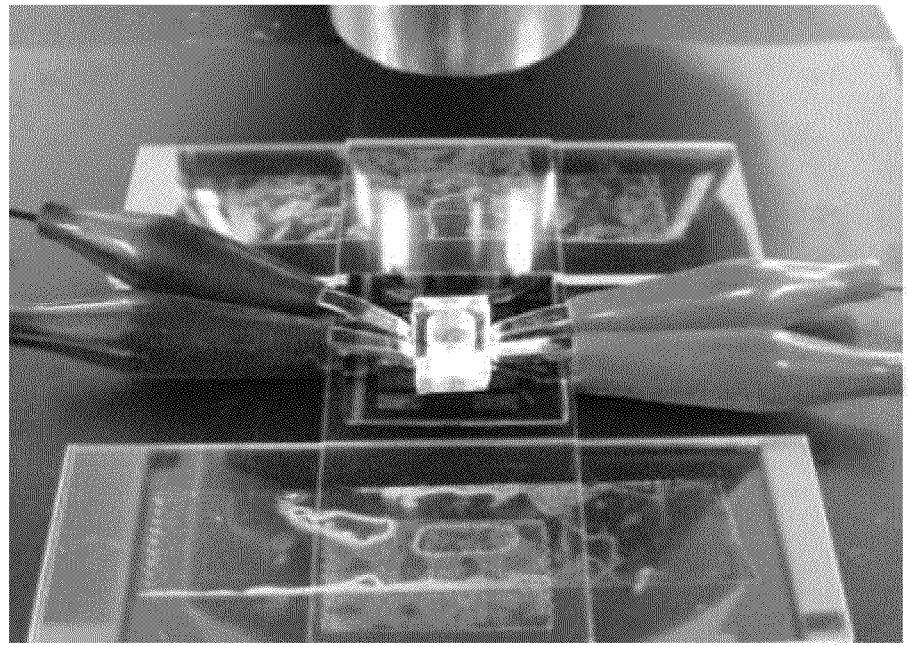
FIG. 6 is a photograph showing an actual apparatus for producing nanostructures locally by a micro heater.
Figure 7:
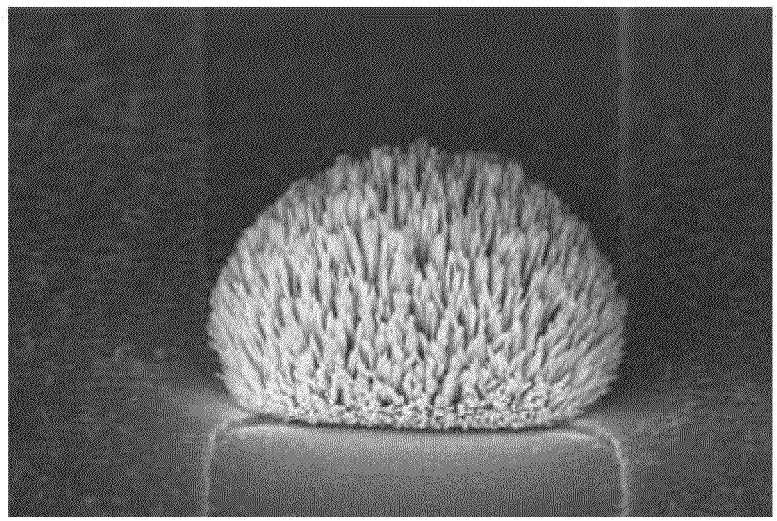
FIGS. 7 to 10 are scanning electron microscope (SEM) photographs of the nanowires grown locally on a micro heater in a liquid phase according to an embodiment of the present invention.
Figure 8:
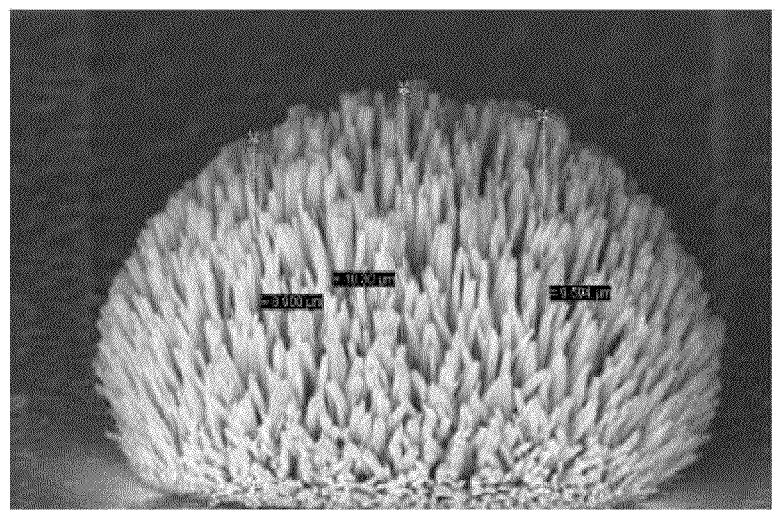
Figure 9:
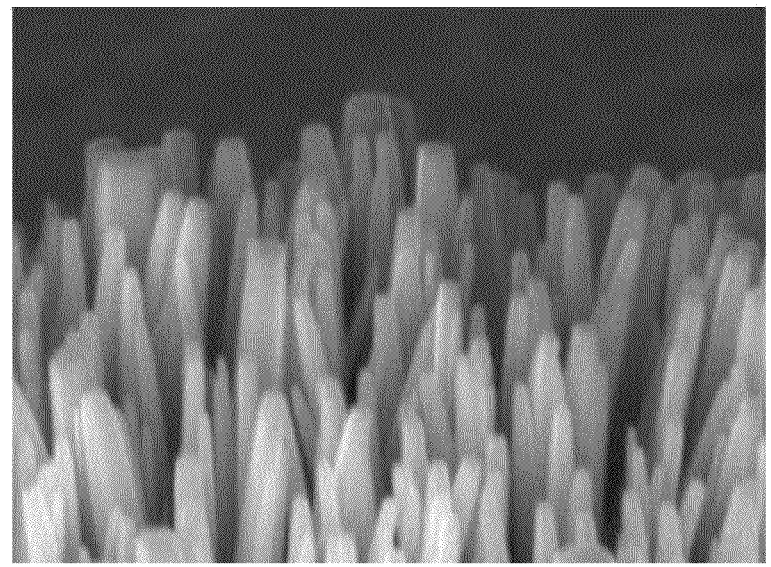
Figure 10:
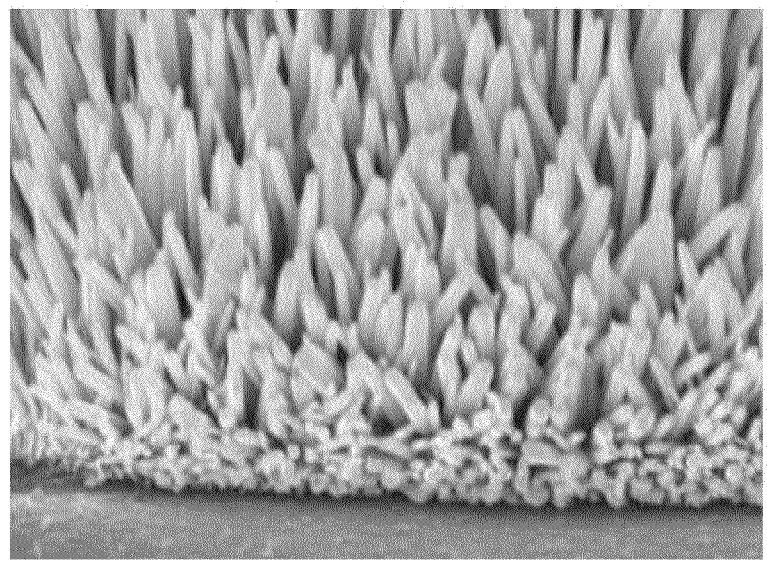

FIG. 5 is a schematic view of an apparatus for producing nanostructures in accordance with an embodiment of the present invention, and FIG. 6 is a photograph showing an actual apparatus for producing nanostructures.

Referring to FIG. 5, the apparatus for producing nanostructures according to an embodiment of the present invention includes a container 400 in which the precursor solution 410 of nanostructures is received. Unlike the gas chamber of the prior art into which gases in a vapor phase are introduced, the apparatus uses a container 400 that receives only the liquid precursor and is relatively smaller than the gas chamber, and thus is significantly cost-efficient. In one embodiment of the present invention, the container 400 has a well-like structure formed in a polymer block, such as polydimethylsiloxane (PDMS), but is not limited thereto. Any structure capable of loading a liquid precursor solution may be used in the present invention.

The container 400 is provided with a heater 420, which is in contact with the precursor solution 410 in the container so that the precursor solution 410 is heated locally and allowed to react. In one embodiment using ZnO, the precursor solution 410 is $Zn(NO_3)_2 \cdot 6H_2O$ and the growing nanostructures are ZnO nanowires. Herein, the heater 420 warms the precursor solution to a temperature equal to or less than 100° C. This is because the aqueous precursor solution containing water boils when it reaches a temperature above 100° C., thereby generating vapor bubbles. However, the present invention is not limited thereto and the heating temperature may be selected freely depending on the properties of the selected solvent with high boiling temperature. It is preferred that the precursor solution is heated to a temperature below the boiling point of the selected solvent. This is because when the solution itself boils, selective nanostructure growth cannot be accomplished as mentioned above.

Production of Nanostructures

First, a heater is fabricated on a silicon-on-insulator (SOI) substrate through an exposure and etching process, wherein the heater has a line width of 3-4 μm and a length of 30-40 μm. However, the present invention is not limited to the dimension set forth herein and the heater may be designed freely depending on the desired size of nanostructures. This is also included in the scope of the present invention. Next, Al wires are connected to the silicon heater so that they are in electric contact with each other. Then, a solution of ZnO nanoparticles having a diameter of 10 nm and dissolved in ethanol to a concentration of 30-50 nM is applied uniformly onto the substrate having the heater, followed by drying, and the substrate is washed with ethanol solution so that the ZnO nanoparticle seeds are scattered uniformly.

After the application of the particles, the substrate is heated on a hot plate to a temperature of 180-250° C. so that the nanoparticles are deposited well on the substrate. A small-size polymer block, such as PDMS, is perforated at the center thereof to form a well in which a liquid is received. Then, the polymer block is attached onto the substrate in such a manner that the heater is placed inside the well. In other words, in one embodiment of the present invention, the container for growing nanostructures has a well structure formed of a polymer material and is removed after the production of the nanostructures.

Then, the precursor solution, i.e., precursor solution containing $Zn(NO_3)_2 \cdot 6H_2O$ in the case of ZnO nanowires, hexamethylene tetramine (HMTA), polyethyleneimine (PEI), or the like, is added in an amount of 1-2 drops into the polymer block well by using a syringe. The well is covered with glass so that it may be observed with a microscope and the precursor solution may not be evaporated during the production of the nanostructures.

After that, a voltage of 2-3 V is applied to both electrodes of the heater to control the temperature in the precursor solution to 90-95° C., i.e. a temperature below the boiling point of the precursor solution, thereby producing ZnO nanostructures gradually. Herein, the voltage is applied continuously until the nanostructures grow to a desired height while the application time is controlled. In this manner, the length and density of the nanostructures increase as described hereinafter. After the nanostructures are fabricated, the polymer block, i.e., the polymer well (container) is removed from the substrate. Then, the nanostructures grown on the substrate are washed with a solvent, such as ethanol, and dried with nitrogen gas.

Analysis of Nanostructures

FIGS. 7 to 10 are scanning electron microscope (SEM) photographs of the nanowires grown in the above-described local heating manner in a liquid phase according to an embodiment of the present invention.

Referring to FIGS. 7 to 10, it can be seen that a plurality of nanowires are grown anisotropically on microheater. Particularly, in one embodiment of the present invention, a nonpolar chelate compound, such as polyethylimide, is used to induce the growth of nanostructures along the z-axis, i.e., the height direction. The nonpolar chelate compound acts on the lateral surface of the growing nanostructures to neutralize the polarity thereof, thereby reducing the lateral activity of the nanostructures. In other words, the nonpolar chelate compound functions as an inhibitor.

Figure 11:
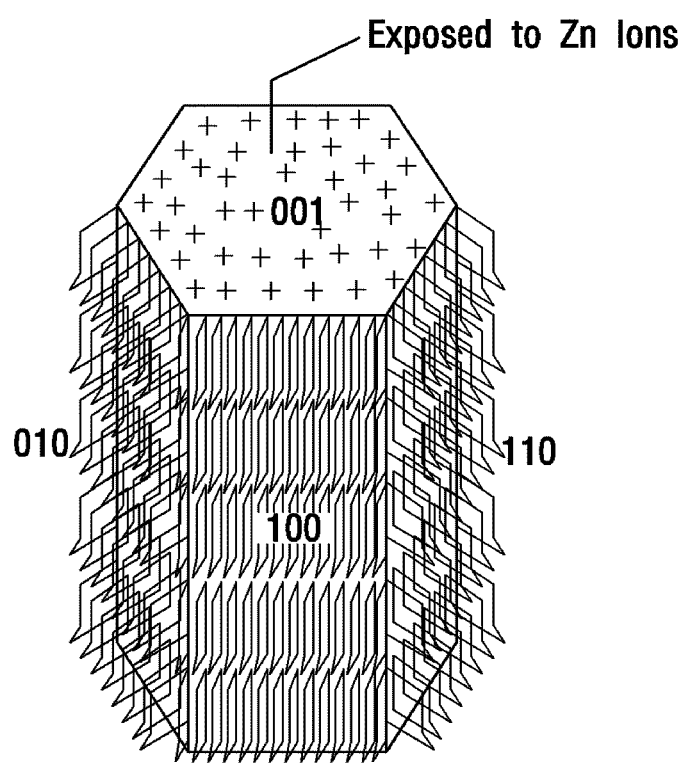
FIG. 11 is a schematic view illustrating how the nanostructures grow along the height direction in the presence of a nonpolar chelate compound, such as polyethylimine (PEI).

FIG. 11 is a schematic view illustrating how the nanostructures grow along the height direction in the presence of a nonpolar chelate compound, such as polyethylimide (A. Sugunan, H. C. Warad, M. Boman, and J. Dutta, "*Zinc oxide nanowires in chemical bath on seeded substrates: Role of hexamine*", *J. Sol-Gel Sci. Techn.* 39, 49-56 (2006)). Referring to FIG. 11, the nanostructures grow along the vertical direction, i.e., the height direction because the section of nanowires maintaining polar property serves as a region for absorbing Zn ions.

Figure 12:
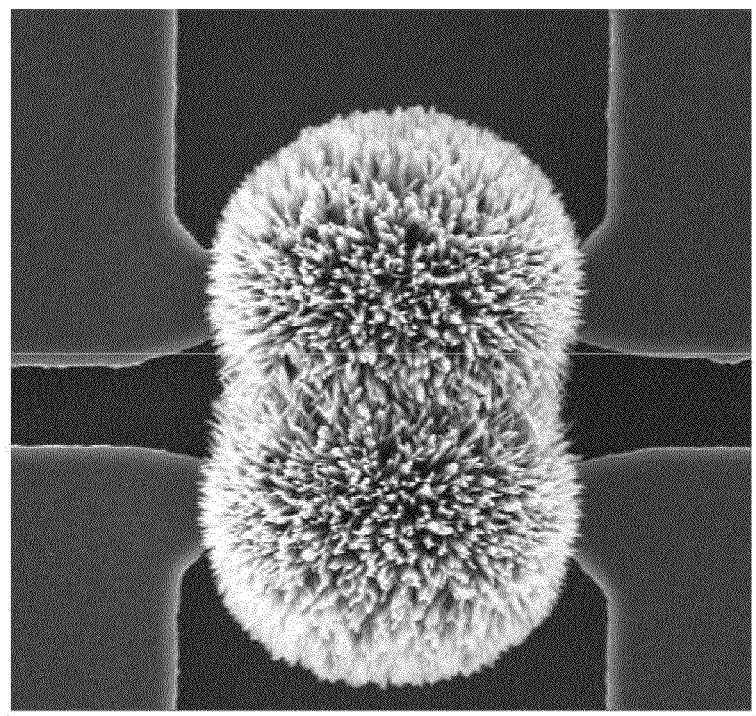
FIG. 12 is a front view of the nanostructures according to an embodiment of the present invention.
Figure 13:
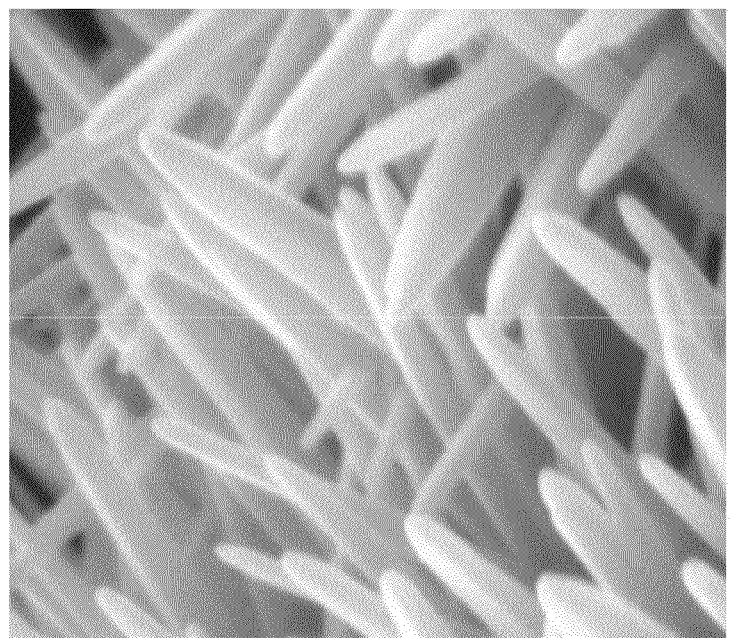
FIG. 13 is a magnified view of the nanostructures grown locally on a micro heater as shown in FIG. 12.

FIG. 12 is a front view of the nanostructures according to an embodiment of the present invention, and FIG. 13 is a magnified view of the nanostructures as shown in FIG. 12.

Referring to FIGS. 12 and 13, the nanostructures grown at different electrodes spaced apart from each other join with each other during their growth in spite of such different starting points. It can be seen that the nanowires are bound and linked physically to each other at the joining point. Such joining allows the electrodes separated physically and electrically from each other to be connected and communicated with each other. Particularly, such a constitution may provide a fundamental structure of various sensor devices for detecting a variation in electric current depending on a change in resistance (such a change in resistance may be caused by gas adsorption, UV detection, etc.). In other words, the method for producing nanostructures according to the present invention enables fabrication, growth and integration of nanostructures at the same time. This is one of the characteristics of the present invention that differ from the prior art including forming nanostructures in a separate step and then growing and integrating the nanostructures. Therefore, it is to be understood that the method for producing nanostructures according to the present invention includes integration of nanostructures as well as simple formation and growth of nanostructures.

Variation in Patterns of Nanostructures

FIGS. 14 to 17 are SEM photographs illustrating various configurations of the nanostructures, i.e., nanowires, nanoplates, micro-rods, etc., obtained according to an embodiment of the present invention.

Referring to FIGS. 14 to 17, the method for producing nanostructures according to the present invention provides nanostructures with various shapes depending on the heating temperature, heating time, precursor compositions, and particular type of seed materials. In any case, it can be seen that the nanostructures are produced at the same position as the portion locally heated by a heater.

Figure 14:
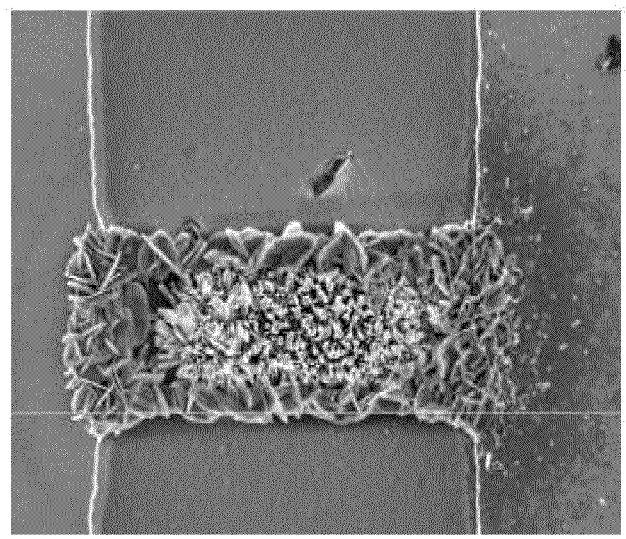
FIGS. 14 to 17 are SEM photographs illustrating various patterns of the nanostructures grown locally on a micro heater, i.e., nanowires, nanorods, nanoplates, and nanodisks obtained according to an embodiment of the present invention.
Figure 15:
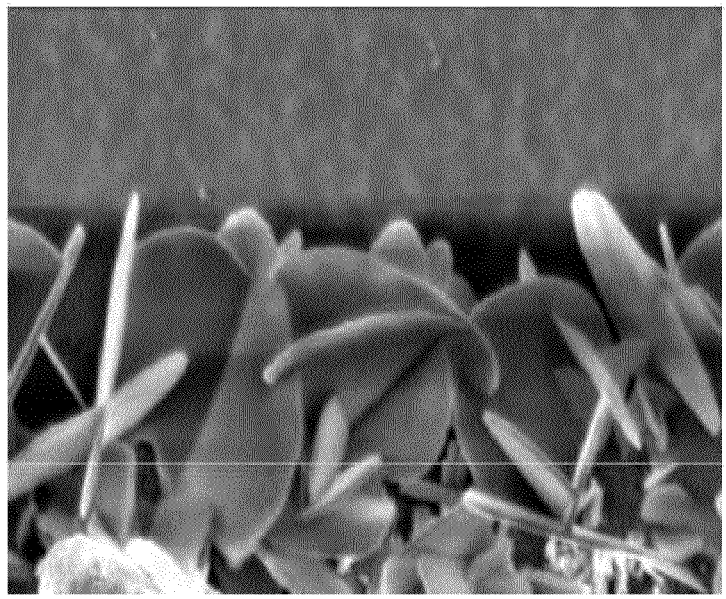
Figure 16:
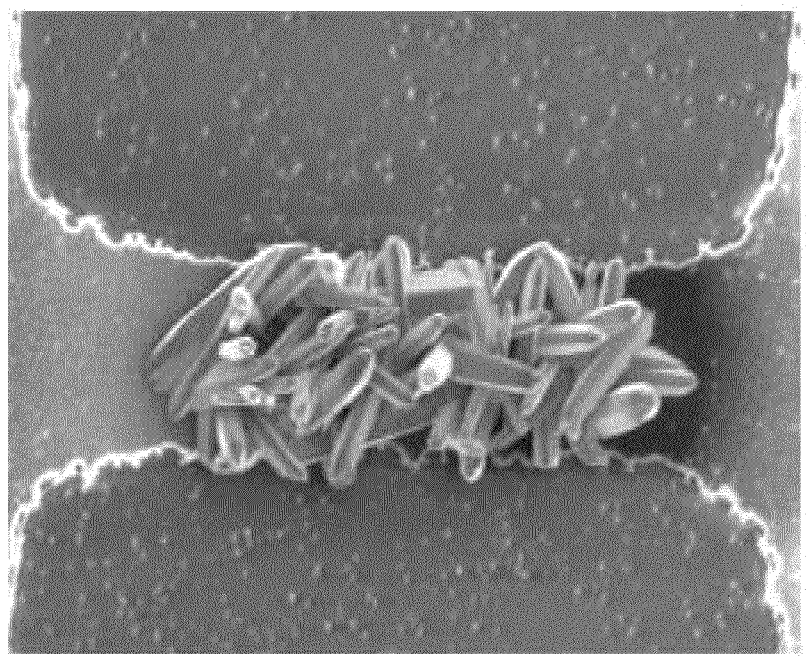
Figure 17:
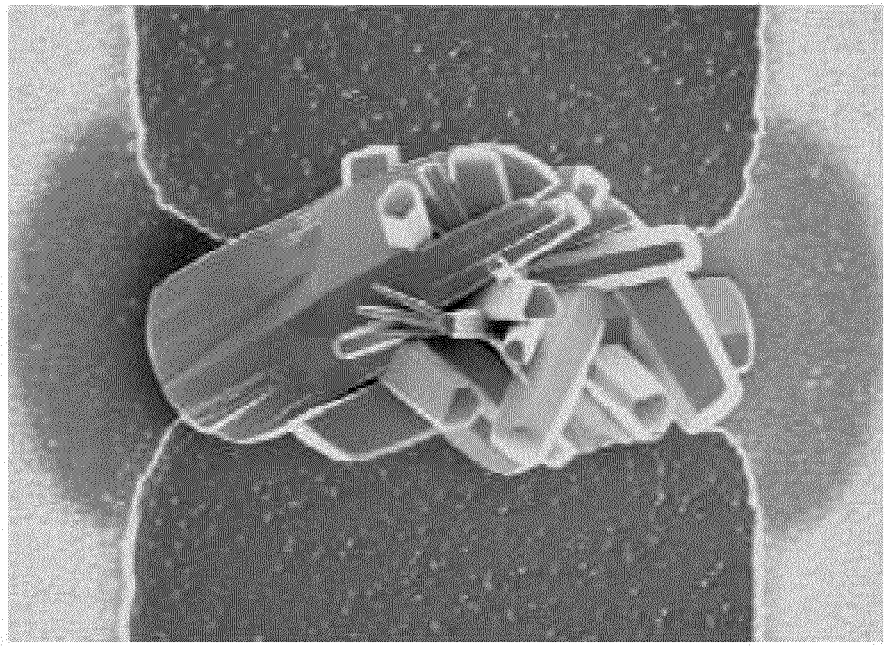

Particularly, it can be seen from FIGS. 14 to 17 that when ZnO nanowires are grown without applying ZnO nanoparticles as seed particles, the resultant grown nanostructures have an increased diameter (FIG. 16). However, when high-concentration ZnO nanoparticles (i.e., seed particles) are used as seeds, the nanoparticles are dispersed with high density, thereby providing nanostructures having a relatively small diameter (FIG. 14). On the contrary, when low-concentration ZnO nanoparticles are used, the nanoparticles are dispersed with low density, so that the resultant nanowires may grow loosely. In addition, a very long growth time increases the diameter of nanowires as described in more detail with reference to FIG. 18.

Growth of Nanostructures

Figure 18:
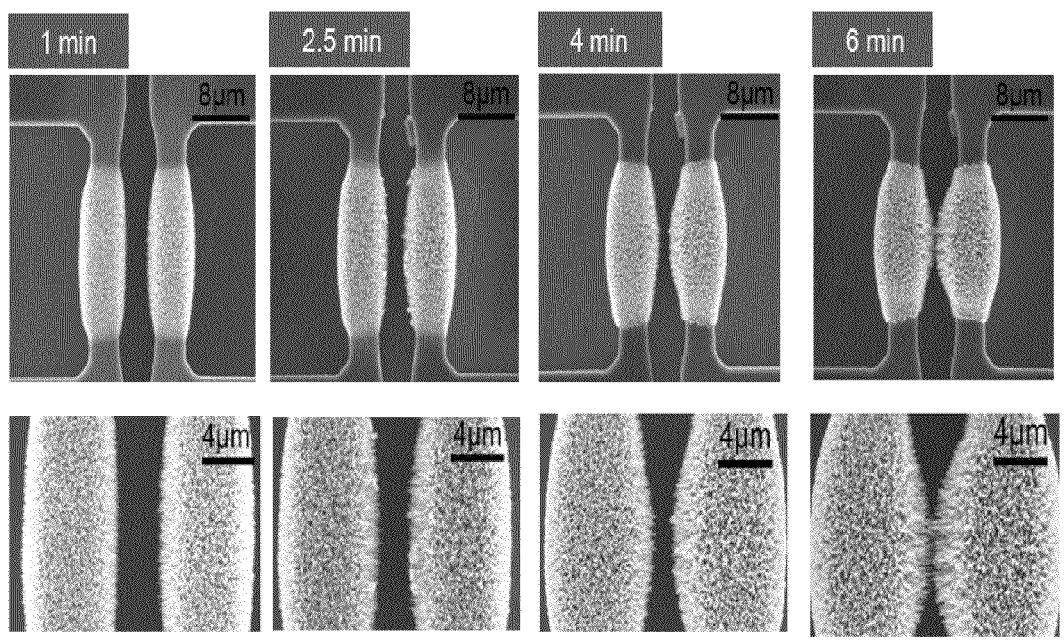
FIG. 18 is an SEM photograph illustrating the growth of nanostructures with the lapse of time on a pair of micro heaters.

FIG. 18 is an SEM photograph illustrating the growth of nanostructures with the lapse of time.

Referring to FIG. 18, the nanostructures grow continuously from the electrodes spaced apart from each other with the lapse of time. In addition, two nanowire structures are connected physically with each other after 6 minutes. Such physical connection plays an important role in the sensor device as described hereinafter. Therefore, the method for producing nanostructures according to the present invention enables integration of nanostructures with the lapse of time. It is thought that this results from the characteristic liquid phase environment in the method of the present invention.

TEST EXAMPLE

UV Sensor

In this example, the ZnO nanowires as the final nanostructures as shown in FIG. 18 are subjected to a test for evaluating an UV sensing effect. To this end, electric voltage is applied between two electrodes and corresponding electric current is measured. Herein, the current is measured both in the presence and in the absence of UV irradiation. In other words, in this example, it is investigated whether the nanostructures obtained in accordance with the present invention function as a sensor or not by using the effect of UV irradiation upon the ZnO nanowires grown by an embodiment of the present invention (i.e., the nanowires are electroconductive in the presence of UV irradiation (365 nm), while they are not conductive in the absence of UV irradiation).

Figure 19:
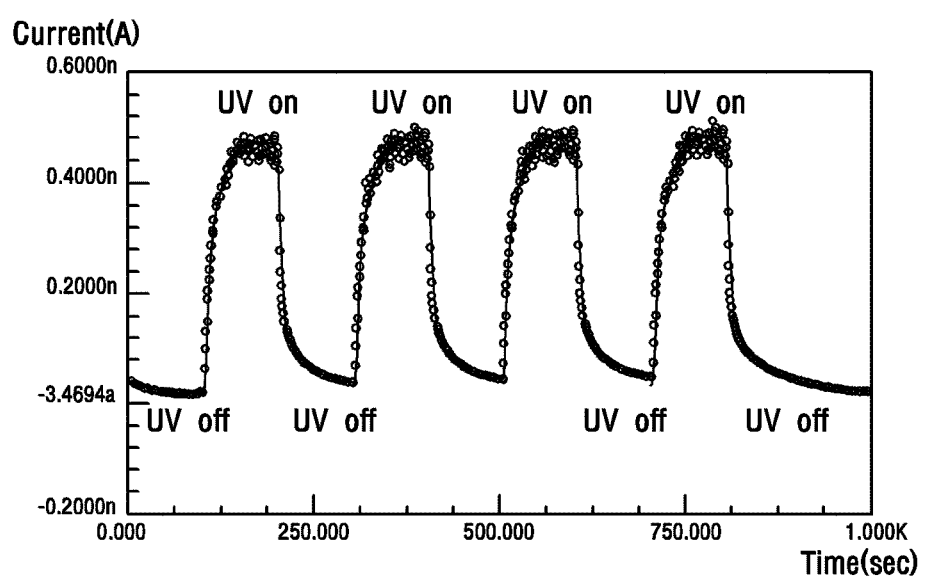
FIG. 19 is a graph showing the ZnO nanowire UV sensor results of Test Example.

FIG. 19 is a graph showing the results of this example.

Referring to FIG. 19, when UV light are irradiated (UV on), electric current flows. However, when UV light are not irradiated (UV off), electric current is substantially reduced.

The above result demonstrates that the nanowires produced between the two spaced electrodes completely function as a sensor that connects the two electrodes electrically. Further, the above result suggests that the method for producing nanostructures according to the present invention allows selective growth of nanostructures, which, in turn, may be used effectively in gas sensors etc. as well as UV sensors.

EXAMPLE 2

Method for Producing Nanostructures by Photon Energy

In another embodiment of the present invention, nanowires are grown in a liquid phase by concentrating photon energy at a specific point of a substrate.

In this manner, nanostructures are grown from a desired point by heating a specific point of a device without any additional patterning step, unlike the prior art that requires patterning of a seed layer or micro heater on a so that the nanostructures may be grown at the point. Further, according to the prior art, a patterning process including exposure and development is performed to define the point, where the nanostructures are to be grown, or a heater is provided. Thus, it is difficult to grow nanostructures with high precision. Moreover, it is required to recover the grown nanostructures and to assemble them precisely. On the contrary, in this embodiment, photon energy such as laser capable of precise control is used to grow nanostructures directly on a random position in a liquid phase. It is also possible to control the resultant nanostructures precisely.

Hereinafter, a particular embodiment of the present invention will be explained in more detail with reference to the accompanying drawings.

Figure 20:
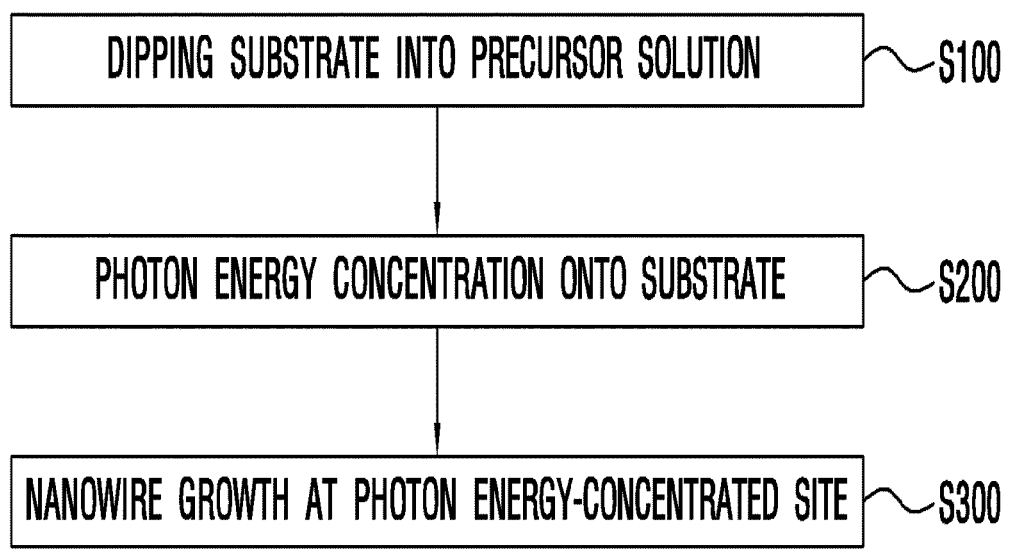
FIG. 20 is a flow chart illustrating the method for producing nanostructures grown by photon energy in accordance with an embodiment of the present invention.

FIG. 20 is a flow chart illustrating the method for producing nanostructures in accordance with an embodiment of the present invention. In the embodiment as shown in FIG. 20, the nanostructures take a nanowire form.

Referring to FIG. 20, a substrate is dipped into a precursor solution containing a metal salt, such as zinc salt, forming the nanowires to be grown (S100). Herein, the substrate may be a device including a metal electrode or bare silicon substrate, where the nanowires will be grown. In this embodiment, the precursor solution includes $Zn(NO_3)_2 \cdot 6H_2O$ from which ZnO nanowires may be grown via a hydrothermal reaction. However, the scope of the present invention is not limited thereto. $SnCl_4 \cdot 5H_2O$ may be used for $SnO_2$ nanowires, $VOSO_4 \cdot xH_2O$ for $V_2O_5$ nanowires, and $KMnO_4/MnSO_4$ for $MnO_2$ nanowires.

In addition, the precursor solution may be an aqueous solution further containing ammonia to form an intermediate of metal complex after the hydrothermal reaction as described in Example 1.

As shown in FIG. 20, photon energy is concentrated at the substrate dipped into the precursor solution so that the nanowires are grown at the point, where the photon energy is concentrated (S200). Unlike heating the precursor solution itself, a local point of the substrate is heated by the photon energy concentrated at a specific point of the substrate dipped into the precursor solution to a desired depth. As a result, the precursor solution adjacent to the local photon energy irradiated point is also heated locally by the heat energy converted from the photon energy, so that the nanowires are grown only at the local point of the substrate (S300).

In one embodiment of the present invention, the nanowires are ZnO nanowires and are synthesized by a hydrothermal reaction through Reaction Scheme 1. In addition, a seed particle layer, such as ZnO, necessary for the synthesis is deposited preliminarily on the substrate. Further, in another embodiment of the present invention, an additional photon energy absorbing film for facilitating the absorption of the photon energy may be provided between the seed layer and the substrate.

[Reaction Scheme 1]

$$Zn^{2+} + 4NH_3 \longleftrightarrow Zn(NH_3)_4^{2+} \qquad \text{(Formula 1)}$$

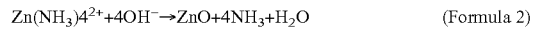

$$Zn(NH_3)_4^{2+} + 4OH^- \rightarrow ZnO + 4NH_3 + H_2O \qquad \text{(Formula 2)}$$

The process according to the prior art includes depositing a seed layer, and patterning and exposing a specific region of a substrate via a semiconductor process in order to induce the growth of nanostructures at a desired point. However, the method according to an embodiment of the present invention allows selective growth of nanowires by irradiating a specific region of a substrate with a laser without such a pre-patterning process.

Subject Material

The same material as described in Example 1 is used.

Apparatus for Production

Figure 21:
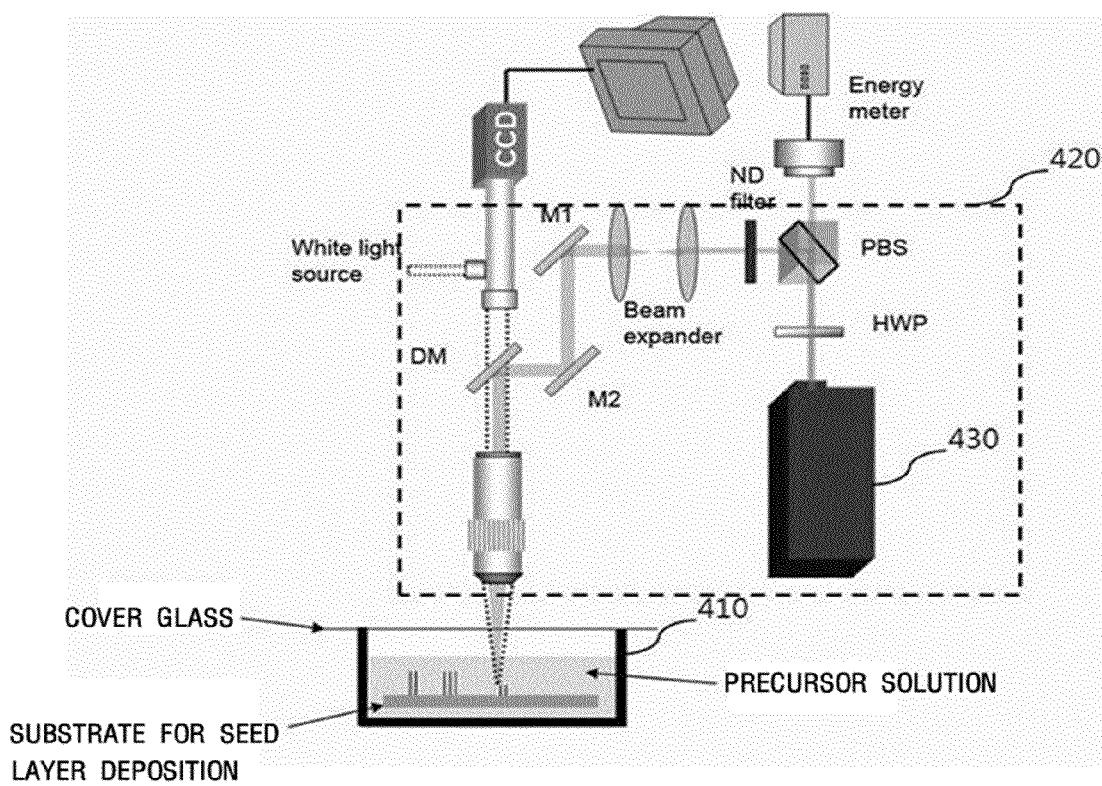
FIG. 21 is a schematic view illustrating an apparatus for producing nanostructures locally grown by concentrated photon energy in accordance with an embodiment of the present invention.

FIG. 21 is a schematic view illustrating an apparatus for producing nanostructures in accordance with an embodiment of the present invention.

Referring to FIG. 21, the apparatus for producing nanostructures includes a container 410 capable of receiving a precursor solution and a substrate S dipped in the precursor solution to a certain depth. The shape and material of the container may be selected freely depending on the size or shape of a device, the characteristics of the precursor solution of the growing nanowires, etc.

The apparatus further includes a photon energy applying unit 420 that applies photon energy to the substrate S dipped in the container 410 so that the substrate is heated locally. In this embodiment, the photon energy applying unit 420 includes a laser beam source 430 and a laser beam path unit 440 for changing and expanding the path of the laser beams generated from the laser beam source 430. In one embodiment of the present invention, the laser source 430 is an argon ion laser with a wavelength range of 514.5 nm and a power of 20-100 mW. Further provided are beam expander for expanding the laser beams irradiated from the laser beam source 430 and mirrors (M1, M2) for extending and changing the path and wave shape of the laser beams. In other words, the apparatus for producing nanostructures according to an embodiment of the present invention controls the growth rate of the nanowires and the size thereof by adjusting the wavelength and characteristics of the laser beams with the above-mentioned elements.

Further, the apparatus may further include a unit capable of changing the laser irradiation point and angle on the substrate. In one embodiment, the container itself may be moved. However, the photon energy applying unit itself may be moved to change the laser irradiation point and angle without departing from the scope of the present invention.

Production of Nanowires

First, provided is a substrate already having a planar surface or microstructure coated with a thin film capable of absorbing photon energy. In this embodiment, a laser with a wavelength of 514.5 nm is used as a photon energy source. A substrate including a glass or quartz substrate coated with a thin gold film capable of absorbing the wavelength of photon energy with ease is also used. However, the scope of the present invention is not limited to the material and the laser wavelength of the above-mentioned planar glass substrate coated with a thin gold film used in this embodiment. Various types of substrate materials, non-planar substrates and various ranges of wavelengths are used without departing from the scope of the present invention.

Then, a solution of ZnO nanoparticles having a diameter of 10 nm and dissolved in ethanol to a concentration of 30-50 nM is applied uniformly onto the substrate coated with the laser absorbing film, followed by drying, and the substrate is washed with ethanol solution so that the ZnO nanoparticle seeds are scattered uniformly.

After the application of the particles, the substrate is heated on a hot plate to a temperature of 180-250° C. so that the nanoparticles are deposited well to the substrate. The substrate having the particles applied thereto is positioned on the bottom surface of the container in which the precursor is to be received. Otherwise, a small-size polymer block, such as PDMS, is perforated at the center thereof to form a well in which a liquid is received. Then, the polymer block is positioned on the substrate on which nanostructures are to be grown. The container or PDMS well is removed after the production of the nanostructures.

Then, the precursor solution, i.e., precursor solution containing $Zn(NO_3)_2 \cdot 6H_2O$ capable of the hydrothermal reaction represented by Reaction Scheme 1 in the case of ZnO nanowires, or HMTA, PEI, etc. is introduced into the container in which the substrate is positioned in such a manner that the substrate is immersed sufficiently in the precursor solution. In addition, the precursor solution is added in an amount of 1-2 drops into the polymer block well by using a syringe in the case of a PDMS well. The container or well containing the precursor solution is covered with glass so that it may be observed with a microscope and the precursor solution may not be evaporated during the production of the nanostructures.

Then, a continuous argon laser with a green wavelength of 514.5 nm is concentrated to a point, where the nanostructures are to be grown, through an objective lens to cause a local temperature increase and growth of the nanostructures at a specific region. The argon laser with a green wavelength is controlled precisely in power through a polarizing beam splitter (PBS) and half wave plate (HWP).

The laser beams passing through the PBS and HWP are further passed through a beam expander so that they are expanded to a larger diameter. Finally, the laser beams reflected through a dichroic mirror (DM) are concentrated on the substrate through the objective lens. Herein, a camera is linked above the objective lens to observe how the nanostructures grow in real time.

According to this embodiment, continuous concentration of laser beams allows the nanostructures to grow about the concentration point. Displacement of the laser beam source allows the nanostructures to move and grow selectively along a line. However, instead of the displacement of the laser source, the substrate is displaced to move and grow the nanostructures at a desired point. Such a variant is also included in the scope of the present invention.

In this embodiment, the laser is controlled in power to control the growth of the nanostructures so that the temperature in the precursor solution is 90-95° C. that is below the boiling point of the precursor solution. The length and density of the nanostructures increase in proportion to the power of the laser applied thereto as described in detail hereinafter. After fabricating the nanostructures, the polymer block, i.e., the polymer well (container) is removed from the substrate, followed by washing with a solvent, such as ethanol and drying with nitrogen gas.

Growth of Nanowires

Figure 22:
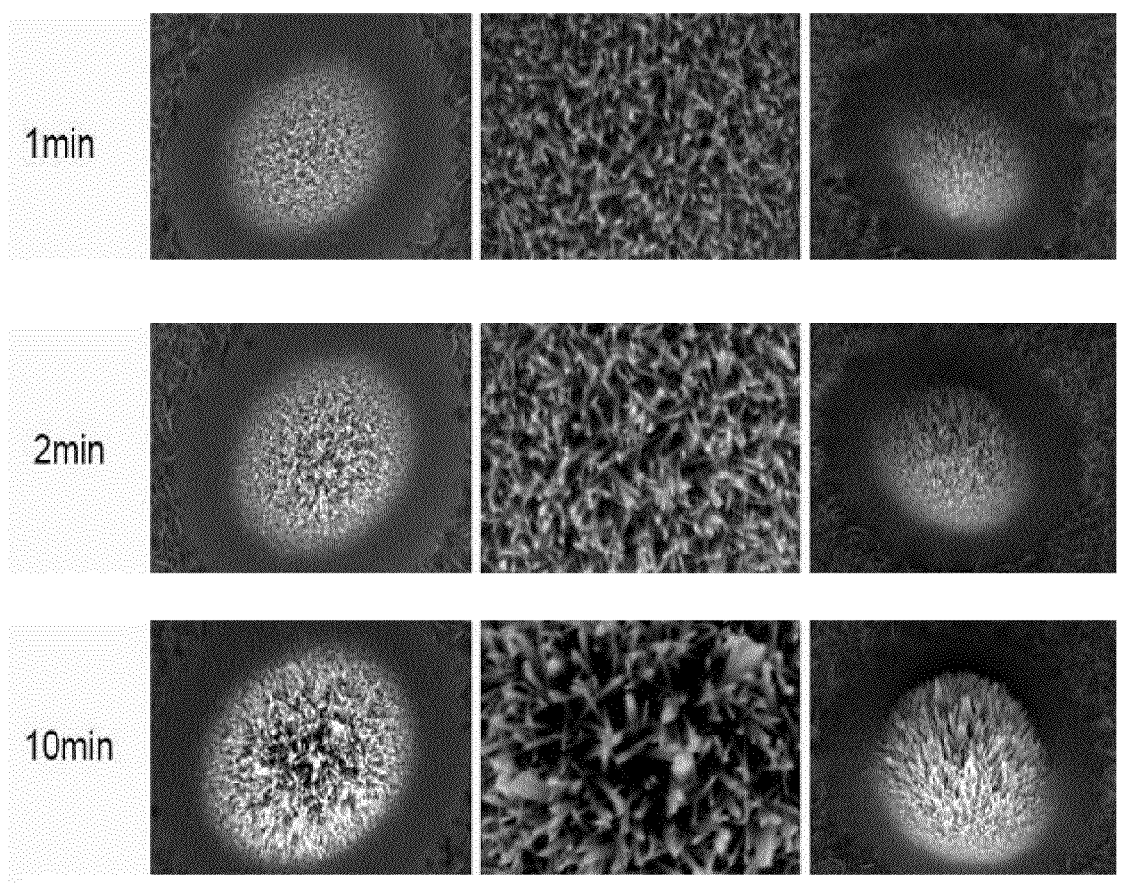
FIG. 22 is an SEM photograph showing the growth of nanowires by concentrated photon energy with the lapse of time.

FIG. 22 is an SEM photograph showing the growth of nanowires with the lapse of time.

Referring to FIG. 22, it can be seen that nanowires grow gradually with the lapse of time after the irradiation of laser beams. Particularly, the temperature distribution on the substrate to which laser beams are irradiated takes the form of a Gaussian function, which suggests that the nanowires grow in the same form as the temperature distribution. Therefore, the growth rate and region of the nanowires may be controlled freely by adjusting the power and wavelength of the laser. This cannot be accomplished by the prior art in which the growth region of nanowires is determined by a CVD or semiconductor process.

Direct Growth from Electrode Material

Unlike the prior art including growing nanowires on a sacrificial substrate and separating them, the method for producing nanowires according to an embodiment of the present invention allows nanowires to grow directly on an electrode material of a device to which the nanowires are applied.

Figure 23:
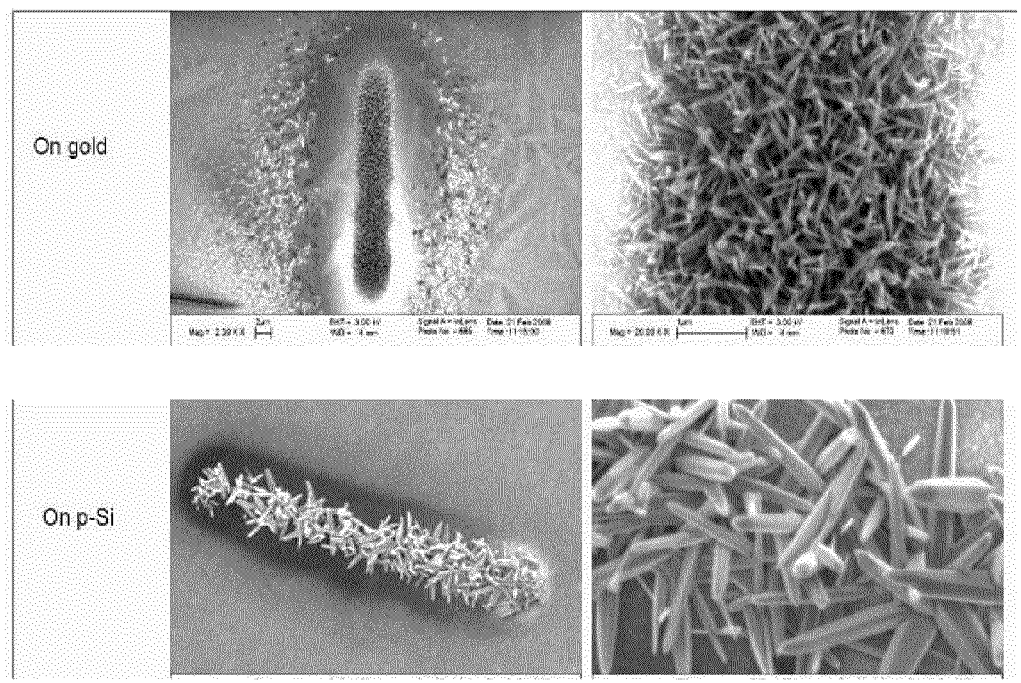
FIG. 23 is an SEM image of nanowires that illustrates local growth of nanowires on Si substrate and arbitrary location growth of nanowires directly on a gold electrode that may be used as an electrode material of an actual device.

FIG. 23 is an SEM image of nanowires that illustrates growth of nanowires on Si substrate and growth of nanowires directly on a gold electrode that may be used as an electrode material of an actual device.

Referring to FIG. 23, it can be seen that when a thin gold film is dipped into the precursor solution of Example 1 and laser beams are irradiated thereto, nanowires grow in the same shape as on the sacrificial substrate.

Further, when using a photon energy source with a wavelength range capable of being absorbed by a specific electrode material on which the nanostructures are to be grown and assembled, other electrode material layers as well as gold can serve as the photon energy absorbing film so that the nanostructures may grow directly from the electrode material.

Selective Growth of Nanowires via Laser Scanning

As described above, the method for producing nanostructures according to an embodiment of the present invention allows selective growth of nanowires by concentrating laser beams at a specific region of a substrate or device.

Figure 24:
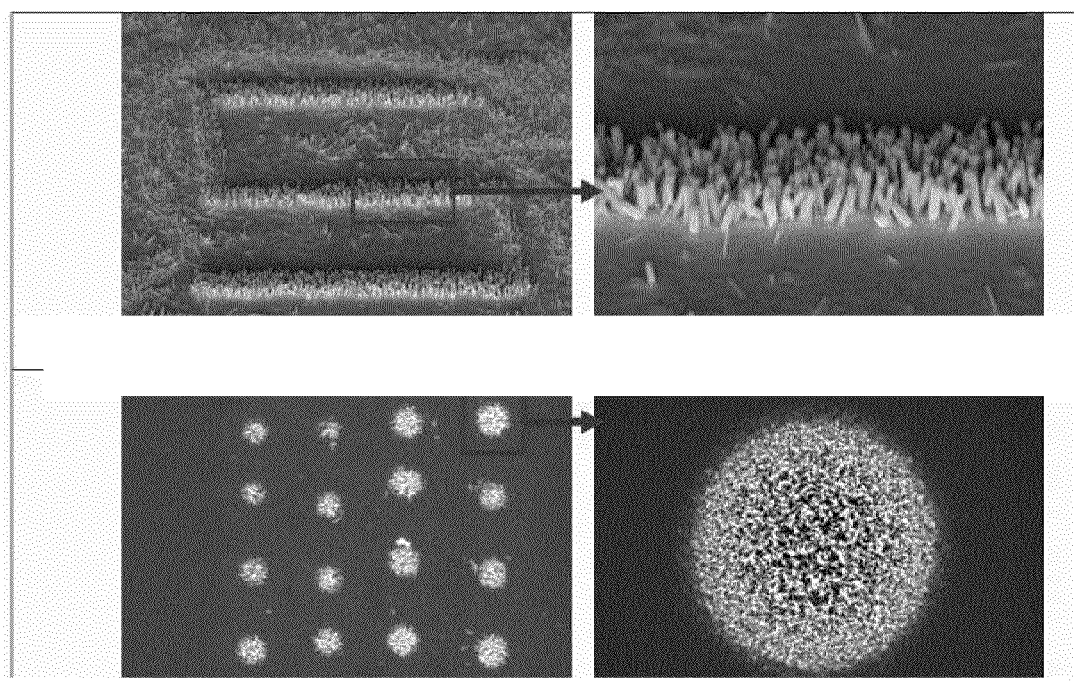
FIG. 24 is an SEM image taken after the selective growth of nanowires via selective laser irradiation to a certain region of a substrate according to an embodiment of the present invention.

FIG. 24 is an SEM image taken after the selective growth of nanowires via laser irradiation to a specific region of a substrate according to an embodiment of the present invention.

Referring to FIG. 24, it can be seen that laser irradiation to a specific region of a substrate induces growth of nanowires in a desired region.

Selective Growth of Nanowires in MEMS Structure

Figure 25:
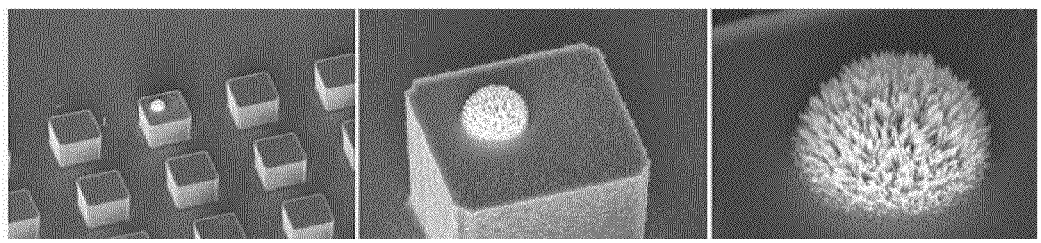
FIGS. 25 and 26 are images that illustrate nanostructures grown and aligned selectively in an MEMS device structure by concentrated photon energy.
Figure 25:
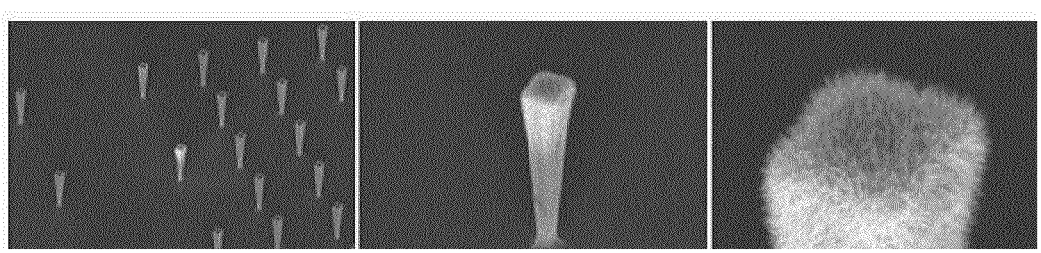
Figure 26:
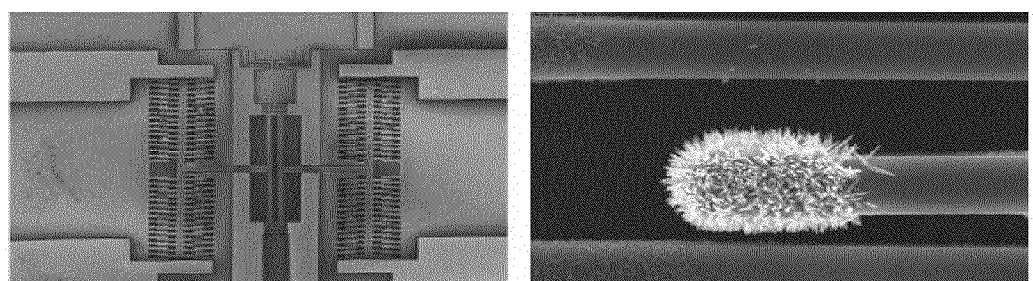
Figure 26:
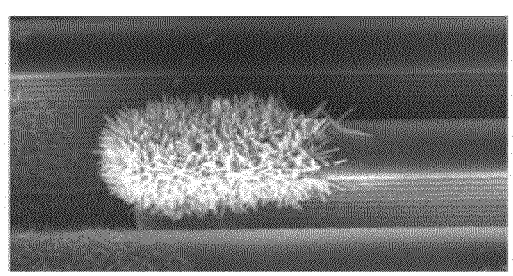

The method for producing nanostructures according to an embodiment of the present invention is also applicable to a microdevice, i.e., MEMS device. Thus, nanostructures are grown and aligned selectively and precisely also in an MEMS device structure, as shown in FIGS. 25 and 26.

Growth of Nanowires as Conductive Wires

Figure 27:
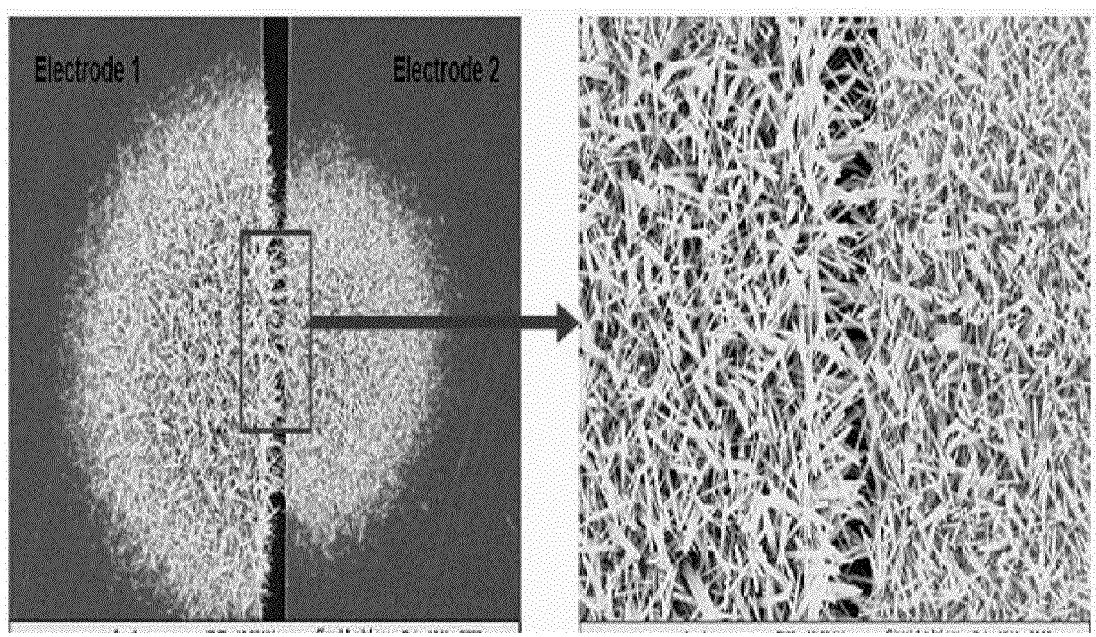
FIG. 27 is an SEM image taken after ZnO nanowires are grown by irradiating laser beams to the opposite points of the electrodes spaced apart from each other in accordance with an embodiment of the present invention.

FIG. 27 is an SEM image taken after ZnO nanowires are grown by irradiating laser beams to the opposite points of the electrodes spaced apart from each other in accordance with an embodiment of the present invention.

Referring to FIG. 27, when laser beams are irradiated to the electrodes dipped into a precursor solution, nanowires grow at the region of the electrode irradiated with the laser beams. Such nanowires grown at one electrode with the lapse of time are in contact with the nanowires grown at the opposite electrode, so that the two electrodes are in contact physically and electrically with each other.

As can be seen from the foregoing, the method according to an embodiment of the present invention allows growth of nanowires directly from a device itself, unlike the prior art including forming nanowires on a substrate, separating the nanowires from the substrate, and aligning and assembling the nanowires on an electrode. In other words, applying laser beams for a certain time allows the nanowires grown on the spaced electrodes to be contacted and connected physically with each other. Such physical connection of the nanostructures plays an important role particularly in sensor devices. In brief, the method for producing nanostructures according to an embodiment of the present invention has an advantage in that it allows integration of nanostructures with the lapse of time. It is thought that such an advantage results from the characteristic of the present invention that the process for producing nanostructures is carried out in a liquid phase environment without liquid evaporation.

While the present invention has been described with respect to the specific embodiments, it will be apparent to those skilled in the art that various changes and modifications may be made without departing from the spirit and scope of the invention as defined in the following claims.

What is claimed is:

1. A method for producing nanostructures by local heating a certain point of an electrode of a microheater dipped into a precursor solution of the nanostructures so that the nanostructures are grown in a liquid phase environment, wherein the electrode of the micro heater in contact with the precursor solution is provided with seed particles of the nanostructure, and the nanostructures grow directly on the electrode of the microheater, wherein the precursor solution contains nonpolar chelate compounds.

2. The method according to claim 1, wherein the nanostructures are grown without boiling of the precursor solution.

3. The method according to claim 1, wherein the nanostructures are grown via a hydrothermal reaction.

4. The method according to claim 1, wherein said heating is carried out at a temperature below the boiling point of the precursor solution.

5. The method according to claim 1, wherein the substrate is provided with a seed layer of the growing nanostructures.

6. The method according to claim 1, wherein the precursor solution of the nanostructures is an aqueous solution containing a metal salt of the nanostructures to be grown and ammonia.

7. The method according to claim 1, wherein a photon energy absorbing film is further provided under the seed layer.

8. The method of claim 1, wherein heating at the certain point of the electrode comprises illuminating the certain point with photon energy in the green light spectrum.

\* \* \* \* \*